US012633919B2

(12) United States Patent
Takata et al.

(10) Patent No.: US 12,633,919 B2
(45) Date of Patent: May 19, 2026

(54) ELECTROSTATIC INPUT DEVICE

(71) Applicant: Alps Alpine Co., Ltd., Tokyo (JP)

(72) Inventors: Masahiro Takata, Miyagi-ken (JP);
Hiroshi Shigetaka, Fukushima-ken (JP)

(73) Assignee: Alps Alpine Co., Ltd., Tokyo (JP)

( * ) Notice: Subject to any disclaimer, the term of this
patent is extended or adjusted under 35
U.S.C. 154(b) by 141 days.

(21) Appl. No.: 18/421,707

(22) Filed: Jan. 24, 2024

(65) Prior Publication Data

US 2024/0264327 A1 Aug. 8, 2024

(30) Foreign Application Priority Data

Feb. 6, 2023 (JP) ................................. 2023-016128

(51) Int. Cl.
H03K 17/96 (2006.01)
H03K 17/955 (2006.01)

(52) U.S. Cl.
CPC ......... H03K 17/962 (2013.01); H03K 17/955
(2013.01); H03K 2217/96015 (2013.01); **H03K
2217/960755** (2013.01)

(58) Field of Classification Search
CPC .... H03K 17/955; H03K 17/962; G06F 3/044;
G06F 3/0443; G06F 2203/04107
USPC ........................... 345/173, 174; 324/658, 663
See application file for complete search history.

(56) References Cited

U.S. PATENT DOCUMENTS

| | | | | |
|---|---|---|---|---|
| 4,237,421 A * | 12/1980 | Waldron | .............. | H03K 17/962 |
| | | | | 327/310 |
| 2008/0140282 A1 | 6/2008 | Ando | | |
| 2008/0252474 A1* | 10/2008 | Nakamura | ........... | H03K 17/955 |
| | | | | 340/657 |
| 2010/0301879 A1* | 12/2010 | Philipp | ................... | G06F 3/044 |
| | | | | 324/679 |
| 2012/0074961 A1* | 3/2012 | Herrmann | ............... | G06F 3/044 |
| | | | | 324/658 |
| 2013/0248344 A1* | 9/2013 | Stilwell | ................ | H03K 17/962 |
| | | | | 200/600 |
| 2019/0227669 A1* | 7/2019 | Maharyta | .............. | G06F 3/0448 |
| 2020/0319735 A1* | 10/2020 | Kim | ...................... | G06F 3/0443 |
| 2023/0094533 A1* | 3/2023 | Krah | .................... | H10H 29/142 |
| | | | | 345/174 |
| 2023/0408300 A1* | 12/2023 | Grisot | .................. | H03K 17/955 |
| 2024/0126397 A1* | 4/2024 | Krill | ...................... | F04D 13/06 |

FOREIGN PATENT DOCUMENTS

| | | |
|---|---|---|
| JP | 2008-143198 | 6/2008 |
| JP | 2010-20674 | 1/2010 |
| JP | 2019-179369 | 10/2019 |

* cited by examiner

*Primary Examiner* — Steven L Yeninas
(74) *Attorney, Agent, or Firm* — Beyer Law Group LLP

(57) ABSTRACT

An electrostatic input device includes a first sensor electrode
for input detection, an electronic part, a second sensor
electrode for noise detection, the second sensor electrode
being placed between the first sensor electrode and the
electronic part, and a measurement circuit that measures the
capacitance of the first sensor electrode and the capacitance
of the second sensor electrode, the measurement circuit
calculating the difference between the capacitance of the
first sensor electrode and a value obtained by multiplying the
capacitance of the second sensor electrode by a constant.

9 Claims, 7 Drawing Sheets

ELECTROSTATIC INPUT DEVICE

CLAIM OF PRIORITY

This application claims benefit of Japanese Patent Application No. 2023-016128 filed on Feb. 6, 2023, which is hereby incorporated by reference.

BACKGROUND OF THE INVENTION

1. Field of the Invention

The present disclosure relates to an electrostatic input device.

2. Description of the Related Art

A vehicle accessory touch switch in related art has a touch portion, having a conductive plate, with which a human body comes into contact, a capacitance measurement unit that measures a change in the capacitance of the conductive plate with respect to a ground conductor, and a controller that controls an accessory unit mounted in a vehicle according to the results of measurements by the capacitance measurement unit. The vehicle accessory touch switch controls the accessory unit in response to the human body's contact with the touch portion. In the touch portion, a plurality of conductive plates are provided so as to be mutually spaced. The capacitance measurement unit measures a change in capacitance between each conductive plate and the ground conductor. The controller controls the accessory unit according to differences among changes in capacitances measured by the capacitance measurement unit (see US2008/0140282A1, for example). Other examples of related art are described in Japanese Unexamined Patent Application Publication Nos. 2010-020674 and 2019-179369.

The vehicle accessory touch switch (input device) in related art is designed to obtain differences among changes in capacitance between a plurality of conductive plates 20-1 to 20-3 and a ground conductor 26 and thereby to reduce the effect of noise.

In a structure in which a plurality of conductive plates are horizontally aligned, however, the extent that the effect of noise can be reduced is not so high.

SUMMARY OF THE INVENTION

In view of the above situation, the present disclosure provides an electrostatic input device that can more reliably reduce the effect of noise.

An electrostatic input device according to an embodiment of the present disclosure includes: a first sensor electrode for input detection; an electronic part; a second sensor electrode for noise detection, the second sensor electrode being placed between the first sensor electrode and the electronic part; and a measurement circuit that measures the capacitance of the first sensor electrode and the capacitance of the second sensor electrode, the measurement circuit calculating the difference between the capacitance of the first sensor electrode and a value obtained by multiplying the capacitance of the second sensor electrode by a constant.

The present disclosure can provide an electrostatic input device that can more reliably reduce the effect of noise.

BRIEF DESCRIPTION OF THE DRAWINGS

FIG. 1C illustrates an example of the structure at a cross section taken along line IC-IC in FIG. 1B;

DESCRIPTION OF THE PREFERRED EMBODIMENTS

An embodiment to which an electrostatic input device in this disclosure is applied will be described below.

The description below is based on an XYZ coordinate system. The description below is based on an XYZ coordinate system. A direction parallel to the X axis, which is an X direction, a direction parallel to the Y axis, which is a Y direction, and a direction parallel to the Z axis, which is a Z direction, are mutually orthogonal. The phrase "in plan view" will refer to an XY plane being viewed. In the description below, for easy understanding of the structure, the length, bulkiness, thickness, and the like of each portion may be indicated by being exaggerated.

Embodiment

Figure 1A:
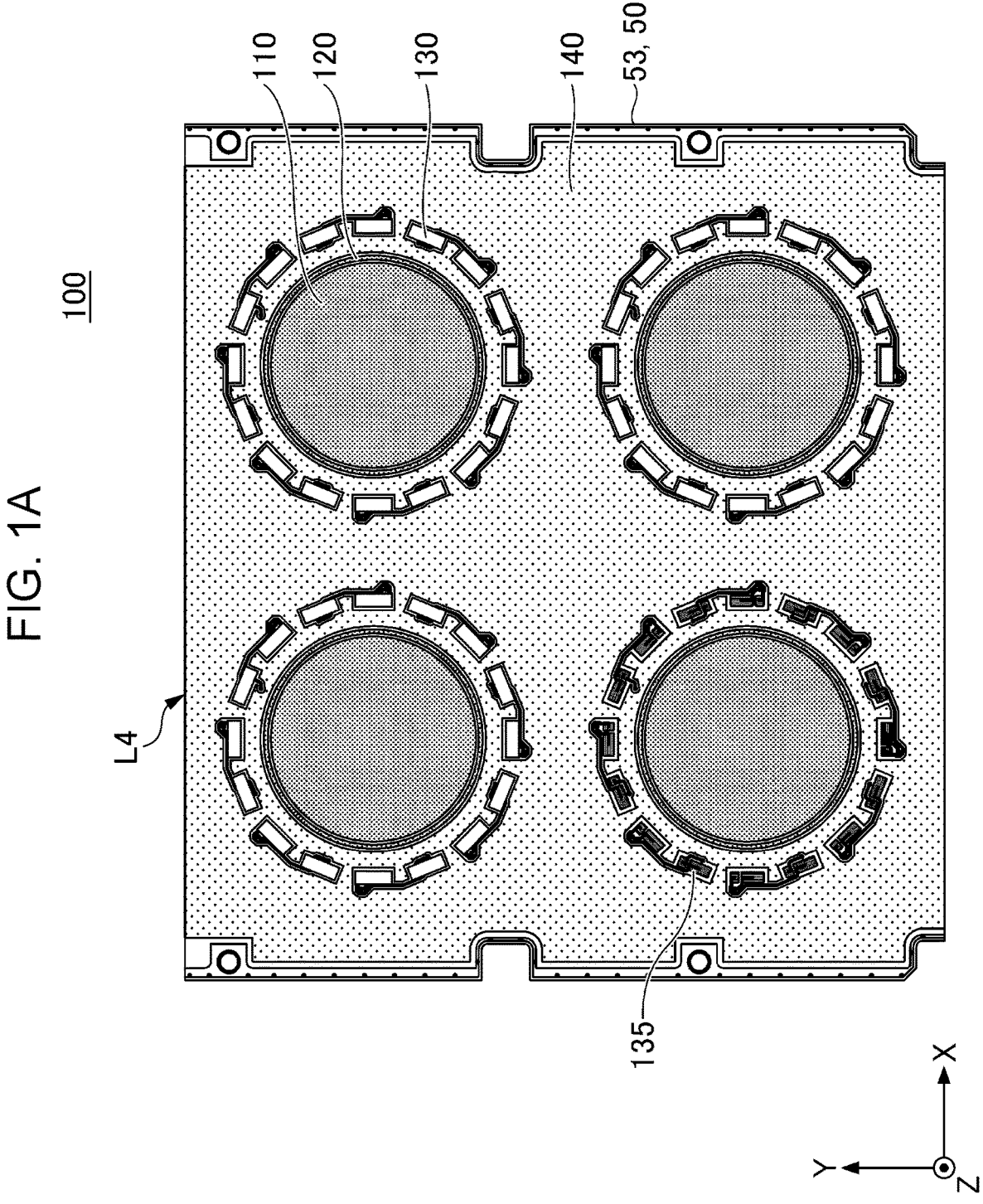
FIG. 1A illustrates an example of the structure of an electrostatic input device in an embodiment.

FIG. 1A illustrates an example of the structure of an electrostatic input device 100 in an embodiment. For example, the electrostatic input device 100 may be an input device at a landing of an elevator that is installed in a store, a facility, or the like and is used by general public, or may be an input device in the cage of the elevator of this type. Alternatively, the electrostatic input device 100 may be a tablet input device or may be the input unit of an automatic teller machine (ATM). Alternatively, the electrostatic input device 100 may be an input unit of a cooking electric appliance that needs to be kept clean. Alternatively, the electrostatic input device 100 may be an input device or the like in a tablet computer, a smart phone, a game machine, a center console in a vehicle, or the like that is individually used.

The electrostatic input device 100 includes a multi-layer substrate 50. The multi-layer substrate 50 has three insulating layers and four wiring layers composed of L1 to L4 layers. That is, the electrostatic input device 100 is composed of four wiring layers. In FIG. 1A, the structure of an L4 layer is illustrated. Descriptions will be given below with reference not only to FIG. 1A but also to FIGS. 1B to 4B.

Figure 1B:
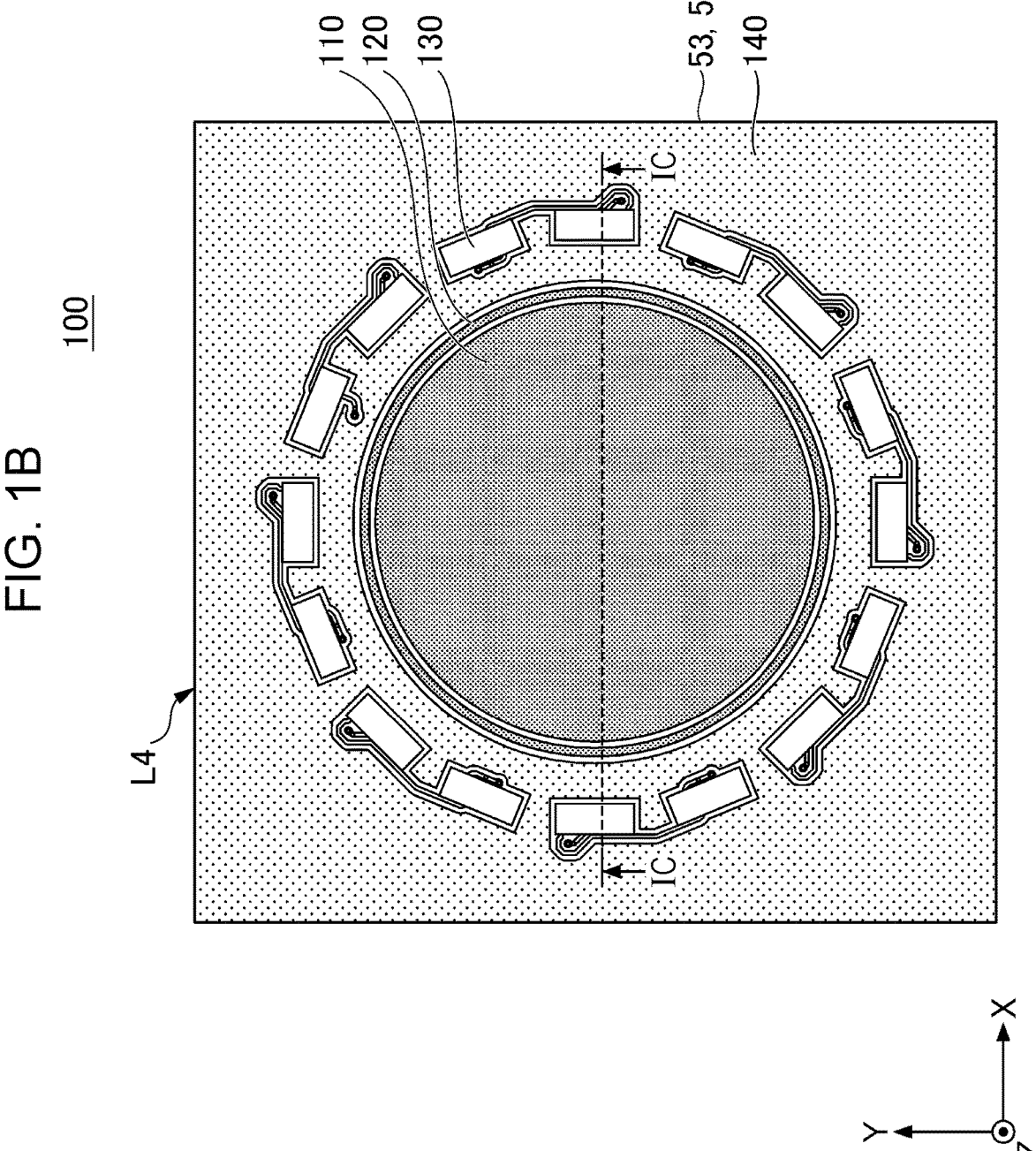
FIG. 1B illustrates an example of the structure of part of a layer of the electrostatic input device in the embodiment.
Figure 1C:
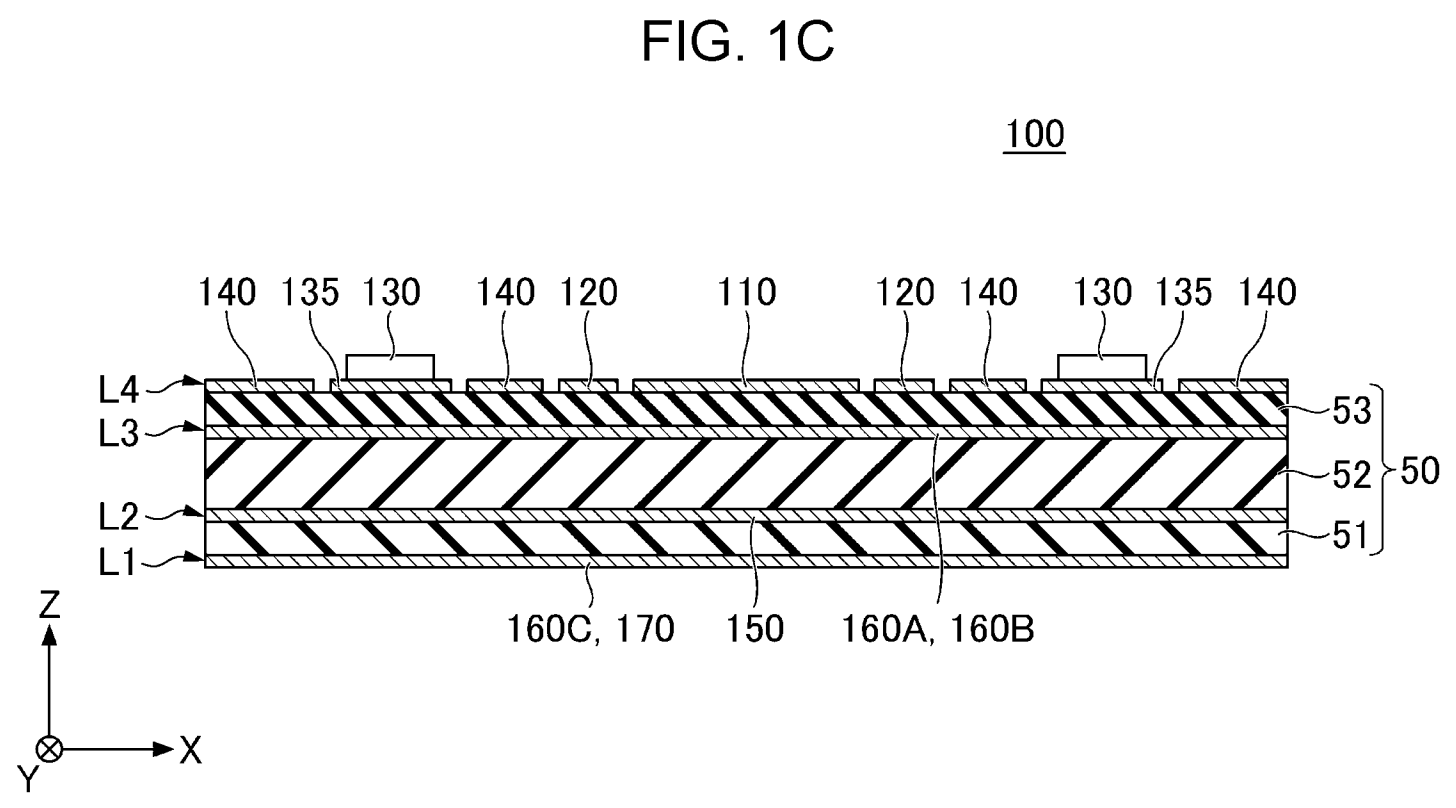
Figure 2:
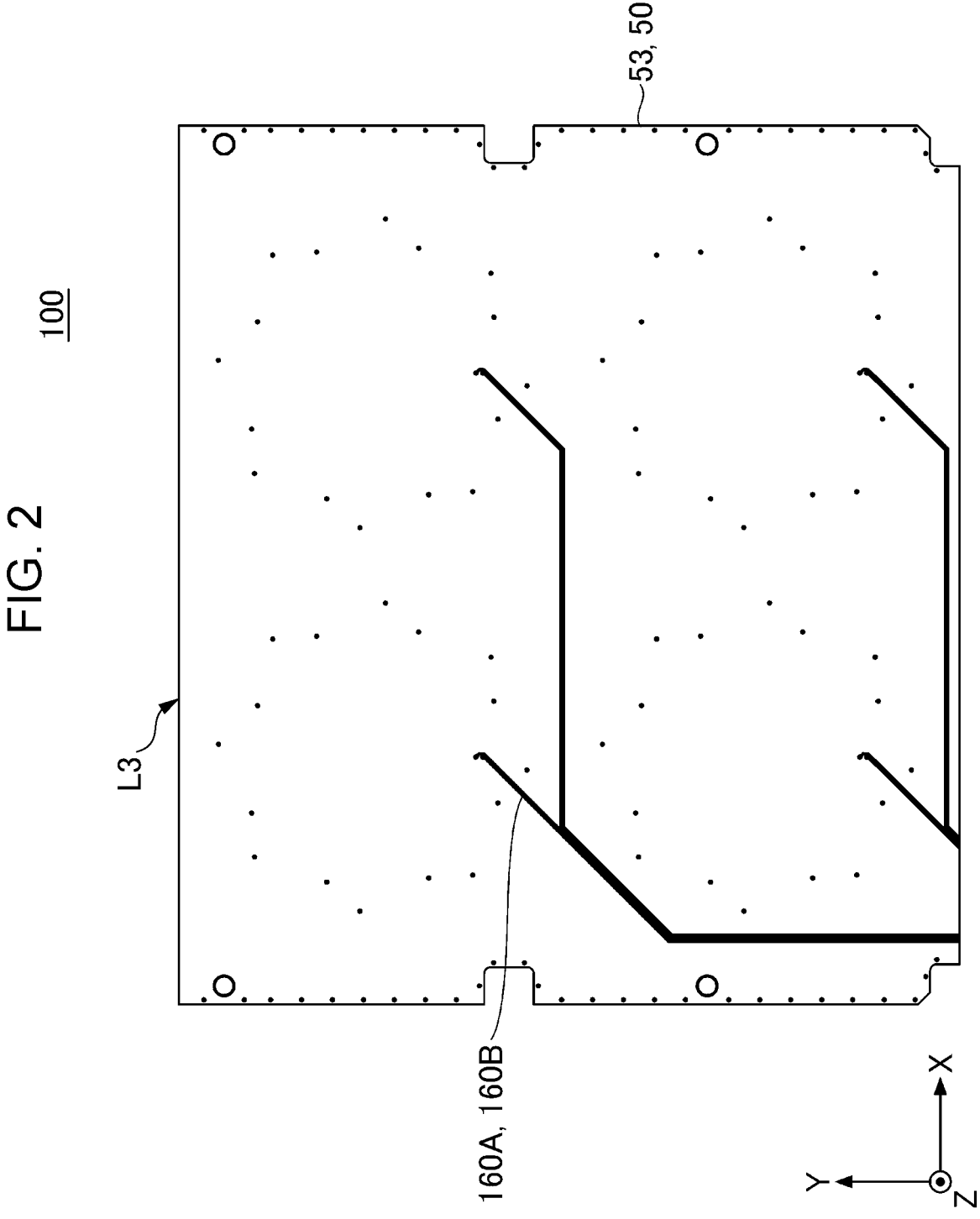
FIG. 2 illustrates an example of the structure of another layer of the electrostatic input device in the embodiment.
Figure 3:
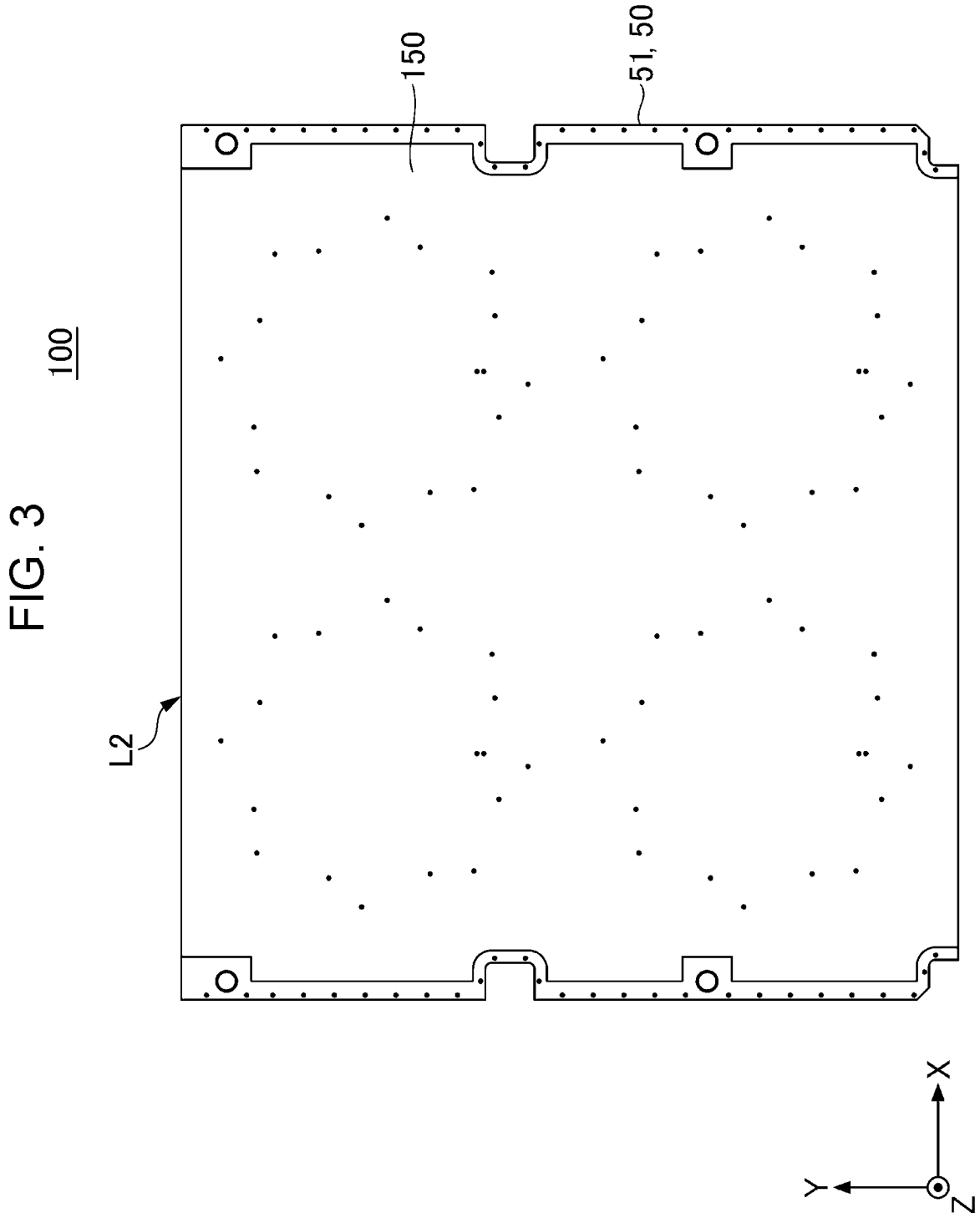
FIG. 3 illustrates an example of the structure of yet another layer of the electrostatic input device in the embodiment.
Figure 4A:
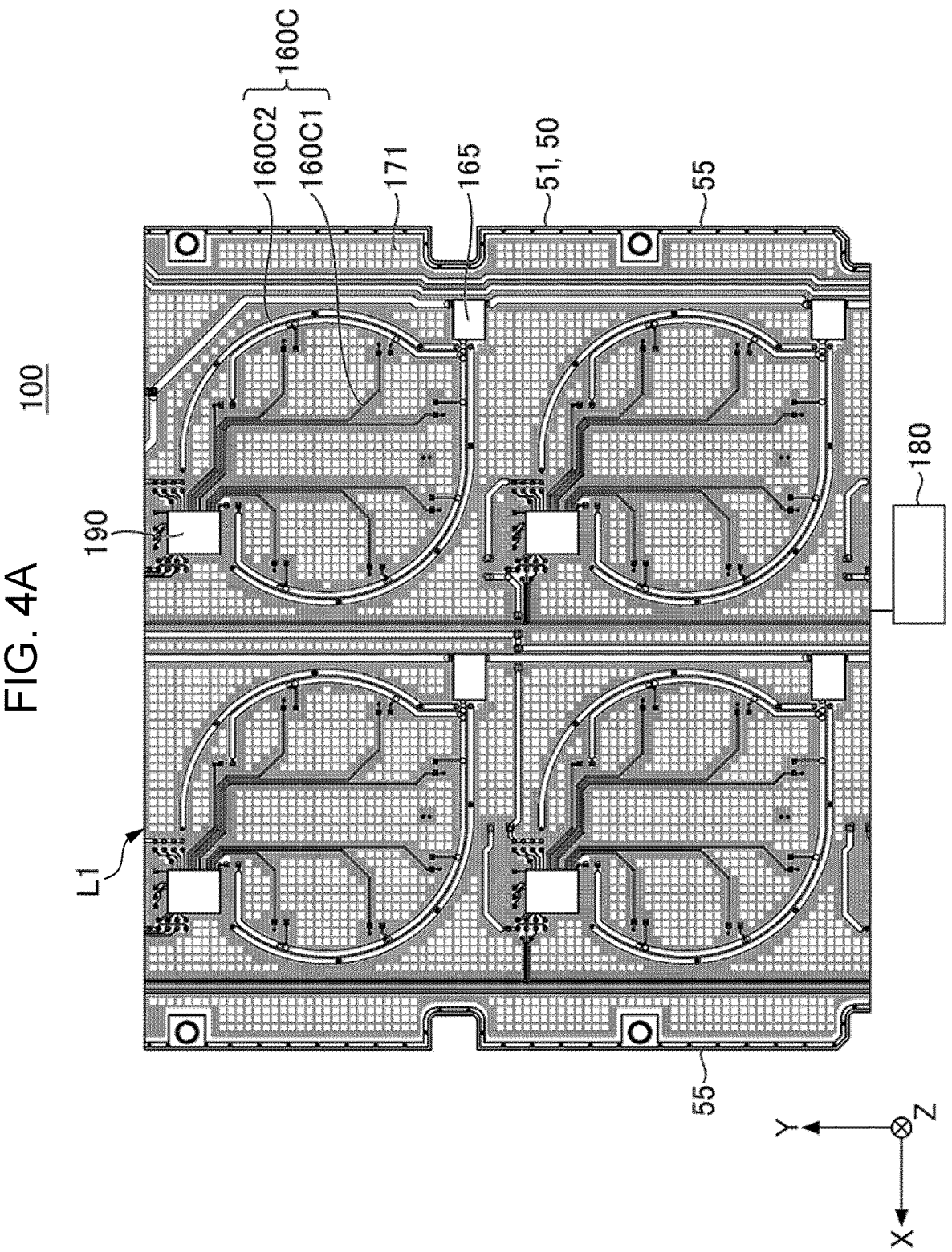
FIG. 4A illustrates an example of the structure of still another layer of the electrostatic input device in the embodiment.
Figure 4B:
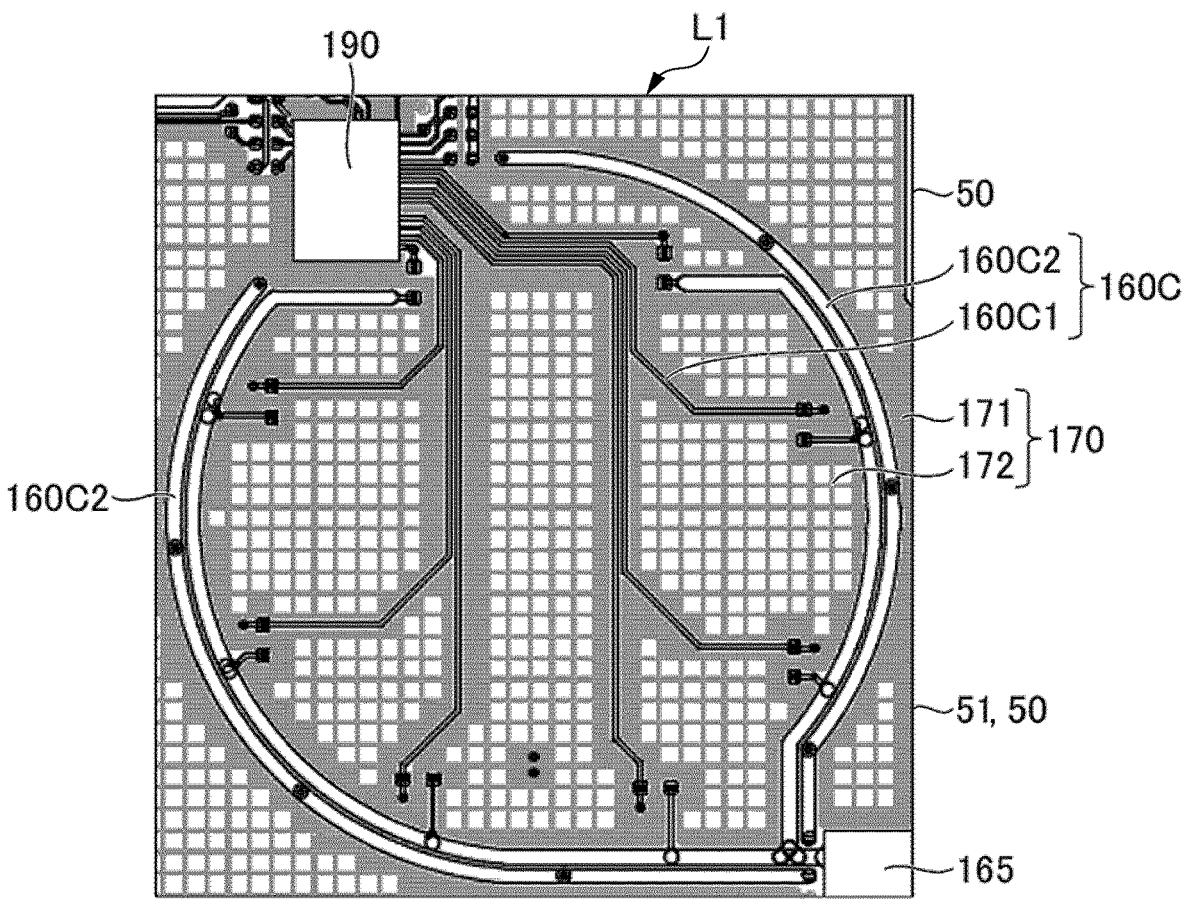
FIG. 4B illustrates an example of the structure of part of the layer, in FIG. 4A, of the electrostatic input device in the embodiment.
Figure 4B:
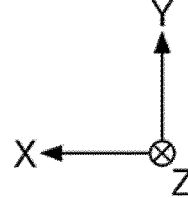

FIG. 1B illustrates an example of the structure of part of the L4 layer of the electrostatic input device 100. FIG. 1C illustrates an example of the structure at a cross section taken along line IC-IC in FIG. 1B. FIG. 2 illustrates an example of the structure of an L3 layer of the electrostatic input device 100. FIG. 3 illustrates an example of the structure of an L2 layer of the electrostatic input device 100. FIG. 4A illustrates an example of the structure of an L1 layer of the electrostatic input device 100. FIG. 4B illustrates an example of the structure of part of the L1 layer of the electrostatic input device 100.

Structure of the Electrostatic Input Device 100

In addition to the multi-layer substrate 50, the electrostatic input device 100 includes a first sensor electrode 110, a second sensor electrode 120, a light-emitting diode (LED) 130, a mounting electrode 135, an active shield electrode 140, an active shield electrode 150, a first wiring 160A, a second wiring 160B, a third wiring 160C, a grounding electrode 170, a control integrated circuit (IC) 180, and a driving IC 190.

The LED 130 may be an example of an electronic part and may be an example of a light-emitting diode. The active shield electrode 140 is an example of a first shield electrode. The active shield electrode 150 is an example of a second shield electrode. The control IC 180 is an example of a measurement circuit. The driving IC 190 is an example of a driving integrated circuit.

Multi-Layer Substrate 50

As an example, the multi-layer substrate 50 has three insulating layers denoted 51 to 53 and four wiring layers denoted L1 to L4, as illustrated in FIG. 1C. The multi-layer substrate 50 illustrated in FIGS. 1A, 1B, 2, 3, and 4A is part of the whole of the multi-layer substrate 50, specifically a portion including four first sensor electrodes 110, as an example. However, the multi-layer substrate 50 only needs to be a multi-layer wiring board equivalent to a portion including at least one first sensor electrode 110.

The L1 layer is disposed on the surface of the insulating layer 51 in the −Z direction. The L2 layer is disposed between the insulating layers 51 and 52. The L3 layer is disposed between the insulating layers 52 and 53. The L4 layer is disposed on the surface of the insulating layer 53 in the +Z direction. The surface of the insulating layer 53 in the +Z direction, the L4 layer being disposed on the surface, is an example of a first surface. The surface of the insulating layer 51 in the −Z direction, the L1 layer being disposed on the surface, is an example of a second surface. The L2 layer and L3 layer are each an inner layer of the multi-layer substrate 50.

In FIG. 1C, the structures of the cross sections of the L1 layer to the L4 layer are simplified, and the control IC 180 and driving IC 190 included in the L1 layer are omitted. In the L1 layer, the third wiring 160C and grounding electrode 170 are disposed. In the L2 layer, the active shield electrode 150 may be disposed. In the L3 layer, s the first wiring 160A and second wiring 160B are disposed. In the L4 layer, the first sensor electrode 110, second sensor electrode 120, mounting electrode 135, and active shield electrode 140 are disposed.

The first sensor electrodes 110, second sensor electrodes 120, mounting electrode 135, active shield electrode 140, active shield electrode 150, first wiring 160A, second wiring 160B, third wiring 160C, and grounding electrode 170, which are included in the L1 layer to the L4 layer, can be manufactured by pattering the L1 layer to the L4 layer, which are metal layers, of the multi-layer substrate 50. As an example, a copper foil or the like can be used as the metal layer.

The multi-layer substrate 50 also includes a wiring 55 disposed along outer edges of the insulating layer 51 on the L1 layer, as illustrated in FIG. 4A. In FIG. 4A, only part of the wiring 55 is illustrated so as to extend in the Y direction along the outer edges of the insulating layer 51 in the +X direction and −X direction. As an example, however, the wiring 55 extends around the entire outer edges of the insulating layer 51. The wiring 55 is separated from other wires and the like and is connected to the ground (grounded)

at a power supply unit (not illustrated). The wiring 55 of this type can be used as countermeasures against static electricity.

First Sensor Electrode 110

The first sensor electrode 110, which is disposed in the L4 layer, detects an input to the electrostatic input device 100. The first sensor electrode 110 is connected to the control IC 180 through a through-hole via, which extends through the insulating layers 51 to 53, and the first wiring 160A (see FIG. 2) in the L3 layer. The first sensor electrode 110 may be driven by a signal including an alternating-current component having the same frequency and the same phase as alternating-current components included in signals supplied to the second sensor electrode 120 and active shield electrode 140.

As an example, the first sensor electrode 110 may be circular in plan view. Although, in FIG. 1A, four first sensor electrodes 110 are illustrated as an example, the electrostatic input device 100 may have a structure in which five or more first sensor electrodes 110 are included or three or fewer first sensor electrodes 110 are included. When the electrostatic input device 100 is used, for example, as an input device (manipulation unit) attached in the cage of an elevator to select a floor at which to stop, the electrostatic input device 100 only needs to include as many first sensor electrodes 110 as there are floors in the building in which the elevator is installed. It suffices for the electrostatic input device 100 to have a structure that includes at least one first sensor electrode 110 of this type.

Second Sensor Electrode 120

The second sensor electrode 120 may be in a circular ring shape that encloses (surrounds) the circumference of one first sensor electrode 110 in plan view. One second sensor electrode 120 is provided around each first sensor electrode 110. Each second sensor electrode 120 may enclose one of the plurality of first sensor electrodes 110 in correspondence to the second sensor electrode 120.

Here, the second sensor electrode 120 is in a circular ring shape because the first sensor electrode 110 is circular in plan view. However, the second sensor electrode 120 only needs to be loop-shaped along the outer edge of the first sensor electrode 110. When the first sensor electrode 110 is rectangular in plan view, for example, the second sensor electrode 120 only needs to be in a rectangular loop shape.

The second sensor electrode 120 is a noise detection sensor electrode disposed between the first sensor electrode 110 and the LED 130. The second sensor electrode 120 is provided to detect noise generated from the LED 130.

The second sensor electrode 120 is connected to the control IC 180 through a through-hole via, which extends through the insulating layers 51 to 53, and the second wiring 160B in the L3 layer. The second sensor electrode 120 may be driven by a signal including an alternating-current component having the same frequency and the same phase as alternating-current components included in signals supplied to the first sensor electrode 110 and active shield electrode 140.

A plurality of LEDs 130 disposed around the second sensor electrode 120 are pulse width modulation-driven (PWM-driven) by the driving IC 190, so they become a noise source. Since the second sensor electrode 120 encloses the first sensor electrode 110, however, noise generated from all LEDs 130 can be detected by the second sensor electrode 120. Since noise generated from all LEDs 130 can also be detected by the first sensor electrode 110, noise can be canceled by calculating the difference between the capacitance of the first sensor electrode 110 and a value obtained by multiplying the capacitance of the second sensor electrode 120 by a constant.

Since the second sensor electrode 120 only needs to be capable of detecting noise generated from the LEDs 130, the area of the second sensor electrode 120 may be smaller than the area of the first sensor electrode 110. In particular, the width of the second sensor electrode 120 is preferably narrow. This is because when the width of the second sensor electrode 120 is narrow, the first sensor electrode 110 and second sensor electrode 120 can detect noise generated from the plurality of LEDs 130 in similar ways. The width of the second sensor electrode 120 is its line width in the direction in which the second sensor electrode 120 extends (in FIG. 1A, the circumferential direction).

LED 130

A plurality of LEDs 130 may be disposed around each second sensor electrode 120. More specifically, one LED 130 is disposed for each of a plurality of mounting electrodes 135 disposed around each second sensor electrode 120. As an example, the plurality of LEDs 130 may be spaced around each second sensor electrode 120 at equal angular intervals when viewed from the center of the first sensor electrode 110. Since the second sensor electrode 120 is disposed around the first sensor electrode 110, the plurality of LEDs 130 disposed around each second sensor electrode 120 is equivalent to a plurality of LEDs 130 disposed around each first sensor electrode 110.

FIG. 1A illustrates a state in which LEDs 130 are mounted on the mounting electrodes 135 disposed around three of the four second sensor electrodes 120. On the mounting electrodes 135 around one second sensor electrode 120 in the –X direction and in the –Y direction, no LED 130 is mounted to indicate the mounting electrodes 135. In the actual product, LEDs 130 are mounted on all mounting electrodes 135.

The LED 130 is connected to the driving IC 190 through the relevant mounting electrode 135, a through-hole via, which extends through the insulating layers 51 to 53, and the third wiring 160C. As an example, the LED 130 may be driven by a PWM driving signal supplied from the driving IC 190. The PWM driving signal is an example of a pulse width modulation driving signal. Since the LED 130 is driven by a PWM driving signal, the LED 130 can finely control illumination at various levels. When the driving IC 190 PWM-drives the LED 130 in this way, the LED 130 becomes a noise source. The LED 130 may be driven so as to be simply switched by being turned on or off, instead of being driven by a PWM driving signal. In this case as well, when the LED 130 is turned on and when it is turned off, noise is generated.

When the LEDs 130 are turned on around the first sensor electrode 110, a state can be indicated in which a contact or another manipulation input has been made for the first sensor electrode 110. When, for example, the electrostatic input device 100 is attached at an elevator landing, the first sensor electrode 110 is a manipulation unit used to select an ascent or a descent, in which case the LEDs 130 indicate which has been selected, an ascent or a descent. When the electrostatic input device 100 is attached in the cage of an elevator, the first sensor electrode 110 is a manipulation unit used to select a floor at which to stop, in which case the LEDs 130 indicate the selected floor at which to stop.

Mounting Electrode 135

As an example, the mounting electrode 135 is connected to the third wiring 160C in the L1 layer through a through-hole via extending through the insulating layers 51 to 53, and is also connected to the driving IC 190 through the third wiring 160C.

Active Shield Electrode 140

The active shield electrode 140 is an electrode that may enclose, in the L4 layer, the plurality of first sensor electrodes 110, the plurality of second sensor electrodes 120, and the plurality of mounting electrodes 135 in plan view. The active shield electrode 140 may be a metal layer without any clearance. That is, in FIG. 1A, the active shield electrode 140 is a metal layer formed without any clearance on substantially the entire surface of the insulating layer 53 in the +Z direction except portions in which the plurality of first sensor electrodes 110, the plurality of second sensor electrodes 120, and the plurality of mounting electrodes 135 are disposed. In other words, on the surface of the insulating layer 53 in the +Z direction, the active shield electrode 140 is formed so as to fill in portions in which the plurality of first sensor electrodes 110, the plurality of second sensor electrodes 120, and the plurality of mounting electrodes 135 are not disposed.

The active shield electrode 140 is connected to the control IC 180 through a through-hole via extending through the insulating layers 51 to 53 and a wiring in the L1 layer, and is also connected to the active shield electrode 150 in the L2 layer through a through-hole via extending through the insulating layer 52.

The active shield electrode 140 may be driven by a signal including an alternating-current component having the same frequency and the same phase as alternating-current components included in signals supplied to the first sensor electrode 110 and second sensor electrode 120. The amplitude of the alternating-current component of the signal supplied to the active shield electrode 140 is larger than the amplitudes of the alternating-current components of the signals supplied to the first sensor electrode 110 and second sensor electrode 120.

The active shield electrode 140 is provided to shield the plurality of first sensor electrodes 110 and the plurality of second sensor electrodes 120 from noise and to suppress parasitic capacitances. The active shield electrode 140 is placed in the vicinity of the plurality of first sensor electrodes 110 and the plurality of second sensor electrodes 120 so that the active shield electrode 140 can shield the plurality of first sensor electrodes 110 and the plurality of second sensor electrodes 120 from noise mainly from a ground potential point such as the ground and can also suppress a parasitic capacitance with respect to the ground potential point.

Active Shield Electrode 150

The active shield electrode 150 is disposed in the L2 layer as illustrated in FIG. 3. The active shield electrode 150 is connected to the active shield electrode 140 in the L4 layer through a through-hole via extending through the insulating layers 52 and 53. The active shield electrode 150 is intended to reduce the effect of noise emitted from the driving IC 190 toward the first sensor electrode 110 and second sensor electrode 120.

As an example, the active shield electrode 150 is disposed at a position at which the active shield electrode 150 overlaps the first sensor electrode 110, second sensor electrode 120, and driving IC 190 in plan view. In the example in FIG. 3, the active shield electrode 150 is disposed on substantially the entire surface of the insulating layer 51 in plan view. However, the active shield electrode 150 only needs to be disposed at a position at which the active shield electrode 150 overlaps any one of the first sensor electrode 110, second sensor electrode 120, and driving IC 190 in plan view.

First Wiring 160A

The first wiring 160A is disposed in the L3 layer as illustrated in FIG. 2, and is provided at a position at which the first wiring 160A overlaps the first sensor electrode 110 in plan view. The first wiring 160A may interconnect the control IC 180 illustrated in FIG. 4A and the first sensor electrode 110 illustrated in FIG. 1A together, with a through-hole via extending through the insulating layers 51 to 53.

Second Wiring 160B

The second wiring 160b is disposed in the L3 layer as illustrated in FIG. 2, and is provided at a position at which the second wiring 160B overlaps the second sensor electrode 120 in plan view. The second wiring 160B may interconnect the control IC 180 illustrated in FIG. 4A and the second sensor electrode 120 illustrated in FIG. 1A together, with a through-hole via extending through the insulating layers 51 to 53.

In the structures described above, the first wiring 160A and second wiring 160B are disposed in the L3 layer, which is an inner layer between the L4 layer of the multi-layer substrate 50 and the L2 layer, which is an inner layer in which the active shield electrode 150 is disposed. In this structure, noise received by the first wiring 160A and second wiring 160B from the driving IC 190 can be reduced.

Third Wiring 160C

The third wiring 160C is disposed in the L1 layer and has a wiring 160C1 and a wiring 160C2, as illustrated in FIG. 4A. One end of the wiring 160C1 is connected to the cathode of the LED 130 through a through-hole via extending through the insulating layers 51 to 53. Another end of the wiring 160C1 is connected to the driving IC 190. One end of the wiring 160C2 is connected to the anode of the LED 130 through a through-hole via extending through the insulating layers 51 to 53. Another end of the wiring 160C2 is connected to a power supply terminal 165.

Since 16 LEDs 130 are provided around the second sensor electrode 120 as an example, the wiring 160C2 branches from the power supply terminal 165 into two ways and extends to a point immediately before the driving IC 190 along the outer edge of the second sensor electrode 120 in plan view so as to draw an arc, as illustrated in FIG. 4B. The wiring 160C1 is provided so as to be positioned inside the outer edge of the second sensor electrode 120 in plan view.

Grounding Electrode 170

The grounding electrode 170 may be disposed at a position, in the L1 layer of the multi-layer substrate 50, at which the grounding electrode 170 overlaps the first sensor electrode 110 and second sensor electrode 120. The grounding electrode 170 may be composed of a first grounding electrode portion 171 and a second grounding electrode portion 172, as illustrated in FIG. 4B.

The first grounding electrode portion 171 may be a metal layer without any clearance. The first grounding electrode portion 171 may enclose the third wiring 160C in a region within a predetermined distance from the third wiring 160C in plan view. The second grounding electrode portion 172 may be a mesh-like metal layer with clearances. The second grounding electrode portion 172 may be disposed outside the region within the predetermined distance from the third wiring 160C in plan view so as to be consecutive to the first grounding electrode portion 171. The shape of the mesh is not limited to a mesh-like quadrangle as illustrated in FIGS. 4A and 4B, but may be any of various other shapes.

The grounding electrode 170 in the L1 layer overlaps the active shield electrode 150 in the L2 layer, and is disposed on substantially the entire surface of the insulating layer 51 in plan view. Therefore, the grounding electrode 170 overlaps substantially the entire surface of the active shield electrode 150. If a comparative grounding electrode formed from a metal layer without any clearance is provided in the L1 layer of this type instead of the grounding electrode 170, a large coupling capacitance is generated because the distance between the comparative grounding electrode and the active shield electrode 150 in the Z direction is short. As a result, the amplitudes of the alternating-current components of signals supplied to the active shield electrode 150 and active shield electrode 140 are reduced due to the effect of a coupling capacitance between the grounding electrode 170 and the active shield electrode 150, so the effect of the active shield may be lowered.

In view of this, the grounding electrode 170 is composed of the first grounding electrode portion 171 and second grounding electrode portion 172 to achieve both reduction in noise at the third wiring 160C and reduction in coupling capacitance between the grounding electrode 170 and the active shield electrode 150.

In the region within the predetermined distance from the third wiring 160C in plan view, noise reduction at the third wiring 160C is achieved by providing the first grounding electrode portion 171 formed from a metal layer without any clearance. Outside the region within the predetermined distance from the third wiring 160C in plan view, the area of a region facing the active shield electrode 150 is reduced to reduce the coupling capacitance by providing the second grounding electrode portion 172 formed from a mesh-like metal layer with clearances so as to be consecutive to the first grounding electrode portion 171. The predetermined distance only need to be appropriately set so that noise at the third wiring 160C is sufficiently reduced and a capacitance due to coupling between the grounding electrode 170 and the active shield electrode 150 can be made sufficiently small.

Control IC 180

As an example, the control IC 180 is disposed in the L1 layer. In FIG. 4A, part of the multi-layer substrate 50 is illustrated as an example. In the L1 layer, the control IC 180 is disposed in a portion outside the part, in FIG. 4A, of the multi-layer substrate 50. The control IC 180 is connected to the first sensor electrode 110, second sensor electrode 120, and active shield electrode 140 through wires and the like, such as the first wiring 160A and second wiring 160B as well as other wires and through-hole vias (not illustrated), included in the multi-layer substrate 50.

The control IC 180 supplies signals including alternating-current components having the same frequency and the same phase to the first sensor electrode 110, second sensor electrode 120, and active shield electrode 140, and drives them. The amplitude of the alternating-current component of the signal supplied from the control IC 180 to the active shield electrode 140 is larger than the amplitudes of the alternating-current components of the signals supplied from the control IC 180 to the first sensor electrode 110 and second sensor electrode 120. Since the control IC 180 supplies signals including these alternating-current components to the first sensor electrode 110, second sensor electrode 120, and active shield electrode 140 and drives them, the control IC 180 shields the plurality of first sensor electrodes 110 and the plurality of second sensor electrodes 120 from noise mainly from a ground potential point such as the ground and also suppresses parasitic capacitances with respect to the ground potential point.

The control IC 180 also calculates the difference between the capacitance of the first sensor electrode 110 and a value obtained by multiplying the capacitance of the second sensor electrode 120 by a constant to cancel a noise level received from the LED 130 due to the difference in area between the first sensor electrode 110 and the second sensor electrode 120. The constant by which the capacitance of the second sensor electrode 120 is multiplied only needs to be set to a value determined according to the ratio of the area of the first sensor electrode 110 to the area of the second sensor electrode 120, distances among places in which the first sensor electrode 110, second sensor electrode 120, and LED 130 are placed, and the amount of actually measured noise. Therefore, noise from the LED 130 can be accurately measured by the second sensor electrode 120, and the capacitance of the first sensor electrode 110 can be accurately measured.

As described above, the control IC 180 shields the plurality of first sensor electrodes 110 and the plurality of second sensor electrodes 120 from noise mainly from a ground potential point such as the ground, and also suppresses a parasitic capacitance with respect to the ground potential point. Then, in this state, the control IC 180 reduces the effect of noise from the LED 130 according to the capacitances of the first sensor electrode 110 and second sensor electrode 120, and calculates the difference in capacitance between the first sensor electrode 110 and the second sensor electrode 120. The control IC 180 then compares the difference in capacitance with a threshold and determines the extent to which a support (pointer) body such as the hand of the manipulator has approached the first sensor electrode 110 to determine the state of a manipulation input. Examples of the state of a manipulation input include a state in which the hand has come into contact with the manipulation surface, a state in which the hand has approached the manipulation surface to a certain extent without the hand having come into contact with the manipulation surface, and a state in which the hand is sufficiently away from the manipulation surface.

Driving IC 190

The driving IC 190 is disposed in the L1 layer as illustrated in FIG. 4A. One driving IC 190 is provided for the 16 LEDs 130 disposed around each second sensor electrode 120. In FIG. 4A, therefore, four driving ICs 190 are illustrated.

Each driving IC 190 is connected to the cathode of the LED 130 through the wiring 160C1 of the third wiring 160C, a through-hole via extending through the insulating layers 51 to 53, and the mounting electrode 135. The anode of each LED 130 is connected to the power supply terminal 165 through the wiring 160C2 of the third wiring 160C. Therefore, when the driving IC 190 applies a PWM driving signal to the cathode of the LED 130, a current flows across the anode and cathode of the LED 130, by which the LED 130 is turned on according to the duty ratio of the PWM driving signal.

The electrostatic input device 100 includes: the first sensor electrode 110 for input detection; the LED 130 (electronic part); the second sensor electrode 120 for noise detection, the second sensor electrode 120 being placed between the first sensor electrode 110 and the LED 130; and the control IC 180 that measures the capacitance of the first sensor electrode 110 and the capacitance of the second sensor electrode 120, the control IC 180 calculating the difference between the capacitance of the first sensor electrode 110 and a value obtained by multiplying the capacitance of the second sensor electrode 120 by a constant. Since the difference between the capacitance of the first sensor electrode 110 and a value obtained by multiplying the capacitance of the second sensor electrode 120 by a constant is calculated, the effect of noise generated from the LED 130 can be reduced. Furthermore, since the second sensor electrode 120 is placed between the first sensor electrode 110 and the LED 130, noise from the LED 130 can be accurately measured with the second sensor electrode 120 and the capacitance of the first sensor electrode 110 can be accurately measured.

Therefore, it is possible to provide the electrostatic input device 100 that can more reliably reduce the effect of noise.

The electronic part may be a light-emitting diode (LED 130). When electronic parts are turned on around the first sensor electrode 110, a state, for example, can be detected in which a manipulation input such as a contact with the first sensor electrode 110 or an approach to it has been made. When, for example, the electrostatic input device 100 is attached at an elevator landing, the first sensor electrode 110 is a manipulation unit used to select an ascent or a descent, in which case the LEDs 130 can indicate which is selected, an ascent or a descent by their lighting state. When the electrostatic input device 100 is attached in the cage of an elevator, the first sensor electrode 110 is a manipulation unit used to select a floor at which to stop, in which case the LEDs 130 can indicate the selected floor at which to stop by their lighting state.

The LED 130 may be driven by a PWM driving signal. In this case, noise is constantly generated from the LED 130 while the LED 130 is turned on. However, when the second sensor electrode 120 for noise detection is placed between the first sensor electrode 110 and the LED 130, noise from the LED 130 can be accurately measured with the second sensor electrode 120 and the capacitance of the first sensor electrode 110 can be accurately measured.

The electrostatic input device 100 may further include the multi-layer substrate 50 in which the mounting electrode 135 for the LED 130 is formed. The first sensor electrode 110, second sensor electrode 120, and mounting electrode 135 may be disposed on the same surface of the multi-layer substrate 50 (included in the L4 layer). The second sensor electrode 120 may enclose the first sensor electrode 110 in plan view. A plurality of LEDs 130 and a plurality of mounting electrodes 135 may be provided around the second sensor electrode 120 in plan view. When a plurality of LEDs 130 are provided around each first sensor electrode 110, the first sensor electrode 110 around which the LEDs 130 are turned on can be easily identified. Noise comes from various directions in the circumference toward the first sensor electrode 110. However, since the second sensor electrode 120 encloses the first sensor electrode 110 in plan view, all noise around the first sensor electrode 110 can be accurately removed.

The first sensor electrode 110 may be circular in plan view. The second sensor electrode 120 may be in a circular ring shape in plan view. The plurality of LEDs 130 may be spaced at equal angular intervals when viewed from the center of the first sensor electrode 110. Since noise evenly comes toward the first sensor electrode 110, there is no unevenness in noise around the first sensor electrode 110. Therefore, all noise around the first sensor electrode 110 can be more accurately removed.

The electrostatic input device 100 may further include the active shield electrode 140 (included in the L4 layer) that encloses the first sensor electrode 110, second sensor electrode 120, and the plurality of mounting electrodes 135 in plan view. The first sensor electrode 110, second sensor electrode 120, and active shield electrode 140 may be driven by signals including alternating-current components having the same frequency and the same phase. Noise from a ground potential point in the circumference of the electrostatic input device 100 can be reduced. A parasitic capacitance with respect to the ground potential point can be suppressed. Therefore, noise around the first sensor electrode 110 can be more accurately removed. As a result, the electrostatic input device 100 can determine an input manipulation with still higher precision.

The electrostatic input device 100 may further include: the driving IC 190 connected to the plurality LEDs 130, the driving IC 190 driving the plurality LEDs 130; and the active shield electrode 150 (included in the L2 layer) connected to the active shield electrode 140. The first sensor electrode 110, second sensor electrode 120, and mounting electrode 135 may be disposed on a first surface of the multi-layer substrate 50 (that is, may be disposed in the L4 layer). The driving IC 190 may be disposed on a second surface of the multi-layer substrate 50 (that is, may be disposed in the L1 layer). The active shield electrode 150 may be disposed in an inner layer of the multi-layer substrate 50 (that is, may be disposed in the L2 layer). The active shield electrode 150 may be disposed at a position at which the active shield electrode 150 overlaps any one of the first sensor electrode 110, second sensor electrode 120, and driving IC 190 in plan view. Therefore, the effect of noise radially emitted from the driving IC 190 can be reduced. Thus, it is possible to provide the electrostatic input device 100 that can further reduce the effect of noise.

The electrostatic input device 100 may further include the first wiring 160A that connects the first sensor electrode 110 and the control IC 180 together and the second wiring 160B that connects the second sensor electrode 120 and the control IC 180 together. The control IC 180 may be connected to the first sensor electrode 110 and second sensor electrode 120, and may be disposed on the second surface of the multi-layer substrate 50 (that is, may be disposed in the L1 layer). The first wiring 160A and second wiring 160B may be disposed in an inner layer (specifically, the L3 layer) between the first surface (below the L4 layer) of the multi-layer substrate 50 and an inner layer (specifically, the L2 layer) in which the active shield electrode 150 is disposed. Noise that the first wiring 160A and second wiring 160B receive from the driving IC 190 can be reduced by the active shield electrode 150. Thus, it is possible to provide the electrostatic input device 100 that can further reduce the effect of noise.

The electrostatic input device 100 may further include: the third wiring 160C that is disposed on the second surface of the multi-layer substrate 50 (that is, included in the L1 layer) and is connected to the LED 130; and the grounding electrode 170 disposed at a position at which the grounding electrode 170 overlaps the first sensor electrode 110 and second sensor electrode 120, the position being on the second surface (above the L1 layer) of the multi-layer substrate 50. The grounding electrode 170 may have: the first grounding electrode portion 171, which is a solid metal layer without any clearance (gap or opening), the first grounding electrode portion 171 enclosing the third wiring 160C in a region within a predetermined distance from the third wiring 160C in plan view; and the second grounding electrode portion 172, which is a mesh-like metal layer with clearances (gaps and/or openings), the second grounding electrode portion 172 being disposed outside the region within the predetermined distance so as to be consecutive to the first grounding electrode portion 171. If a capacitance between the active shield electrode 150 and the grounding electrode 170 becomes too large, the electromagnetic wave (noise) shielding effect of the active shield electrode 150 is reduced. Therefore, when the second grounding electrode portion 172 in a mesh-like shape is used in a portion in which shielding of electromagnetic waves (noise) is not so required, the capacitance between the active shield electrode 150 and the grounding electrode 170 can be reduced and the electromagnetic wave (noise) shielding effect of the active shield electrode 150 can be improved.

The electrostatic input device 100 may include a plurality of first sensor electrodes 110 and a plurality of second sensor electrodes 120. Each second sensor electrode 120 may enclose one of the plurality of first sensor electrodes 110 in correspondence to the second sensor electrode 120. A plurality of LEDs 130 may be disposed around each second sensor electrode 120 in plan view. Each second sensor electrode 120 and a plurality of LEDs 130 disposed around the second sensor electrode 120 may be enclosed by the active shield electrode 140, which is a metal layer without any clearance, in plan view. In the entire region in which the plurality of first sensor electrodes 110 and the plurality of second sensor electrodes 120 are placed, noise from a ground potential point and a parasitic capacitance with respect to the ground potential point can be suppressed, so noise can be further accurately removed. As a result, the electrostatic input device 100 can determine an input manipulation with still higher precision.

This completes the description of the electrostatic input device in an exemplary embodiment of the present disclosure. However, the present disclosure is not limited to specifically disclosed embodiments, but can be varied and modified in various other ways without departing from the scope of the claims.

The following further discloses various aspects of the electrostatic input device in relation to the above embodiment.

An electrostatic input device in accordance with one aspect of the embodiment comprises a first sensor electrode for input detection, an electronic part, a second sensor electrode for noise detection, the second sensor electrode being placed between the first sensor electrode and the electronic part, and a measurement circuit that measures the capacitance of the first sensor electrode and the capacitance of the second sensor electrode, the measurement circuit calculating the difference between the capacitance of the first sensor electrode and a value obtained by multiplying the capacitance of the second sensor electrode by a constant.

In the electrostatic input device described above, the electronic part may be a light-emitting diode. The light-emitting diode may be driven by a pulse width modulation driving signal.

The electrostatic input device described above may further comprise a multi-layer substrate in which a mounting electrode on which the electronic part is mounted is formed. The first sensor electrode, the second sensor electrode, and the mounting electrode are disposed on the same surface of the multi-layer substrate, and the second sensor electrode encloses the first sensor electrode in plan view. A plurality of electronic parts and a plurality of mounting electrodes may be provided around the second sensor electrode in plan view.

In the electrostatic input device described above, the first sensor electrode may be circular in plan view, the second sensor electrode may be in a circular ring shape in plan view, and the plurality of electronic parts are spaced at equal angular intervals when viewed from the center of the first sensor electrode.

The electrostatic input device described above may further comprise a first shield electrode that encloses the first sensor electrode, the second sensor electrode, and the plurality of mounting electrodes in plan view, wherein the first sensor electrode, the second sensor electrode, and the first shield electrode are driven by signals including alternating-current components having the same frequency and the same phase.

The electrostatic input device described above may further comprise a driving integrated circuit connected to the plurality of electronic parts, the driving integrated circuit driving the plurality of electronic parts, and a second shield electrode connected to the first shield electrode. The first sensor electrode, the second sensor electrode, and the mounting electrode may be disposed on a first surface of the multi-layer substrate, the driving integrated circuit may be disposed on a second surface of the multi-layer substrate, the second shield electrode may be disposed in an inner layer of the multi-layer substrate, and the second shield electrode may be disposed at a position at which the second shield electrode overlaps any one of the first sensor electrode, the second sensor electrode, and the driving integrated circuit in plan view.

The electrostatic input device described above may further comprise a first wiring that connects the first sensor electrode and the measurement circuit together, and a second wiring that connects the second sensor electrode and the measurement circuit together. The measurement circuit may be connected to the first sensor electrode and to the second sensor electrode, and disposed on the second surface of the multi-layer substrate, and the first wiring and the second wiring may be disposed in another inner layer between the first surface of the multi-layer substrate and the inner layer in which the second shield electrode is disposed.

The electrostatic input device described above may further comprise a third wiring that is disposed on the second surface of the multi-layer substrate and is connected to the electronic part, and a grounding electrode disposed at a position at which the grounding electrode overlaps the first sensor electrode and the second sensor electrode, the position being on the second surface. The grounding electrode may include a first grounding electrode portion, which is a metal layer without any clearance, the first grounding electrode portion enclosing the third wiring in a region within a predetermined distance from the third wiring in plan view, and a second grounding electrode portion, which is a mesh-like metal layer with clearances, the second grounding electrode portion being disposed outside the region within the predetermined distance so as to be consecutive to the first grounding electrode portion.

In the electrostatic input device described above, a plurality of first sensor electrodes, each of which is the first shield electrode, may be included, and a plurality of second sensor electrodes, each of which is the second sensor electrode, may be included. Each second sensor electrode encloses one of the plurality of first sensor electrodes in correspondence to the second sensor electrode. A plurality of electronic parts, each of which the electronic part, may be disposed around each second sensor electrode in plan view, and each second sensor electrode and the plurality of electronic parts disposed around the second sensor electrode may be enclosed by a first shield electrode, which is a metal layer without any clearance, in plan view.

What is claimed is:
1. An electrostatic input device comprising:
at least one first sensor electrode disposed on a multi-layer substrate, configured to detect an input operation;
a plurality of electronic parts disposed on the multi-layer substrate;
at least one second sensor electrode disposed on the multi-layer substrate, configured to detect a noise from the plurality of electronic parts, the second sensor electrode being disposed between the first sensor electrode and the plurality of electronic parts;
a first shield electrode disposed on the multi-layer substrate; and
a measurement circuit configured to measure a capacitance of the first sensor electrode and a capacitance of the second sensor electrode, the measurement circuit calculating a difference between the capacitance of the first sensor electrode and a proportioned capacitance which is a value obtained by multiplying the capacitance of the second sensor electrode by a constant,
wherein, in plan view from a direction normal to the multi-layer substrate, the second sensor electrode surrounds the first sensor electrode, the plurality of electronic parts are disposed around the second sensor electrode, and the first shield electrode encloses each of the first sensor electrode, the second sensor electrode, and the plurality of electronic parts,
and wherein the first sensor electrode, the second sensor electrode, and the first shield electrode are driven by signals each including an alternating-current component having a same frequency and a same phase.
2. The electrostatic input device according to claim 1, wherein the plurality of electronic parts are light-emitting diodes.
3. The electrostatic input device according to claim 2, wherein the plurality of light-emitting diodes are driven by a pulse width modulation driving signal.
4. The electrostatic input device according to claim 1, further comprising:
a plurality of mounting electrodes formed on the multi-layer substrate, the plurality of electronic parts being mounted on the plurality of mounting electrodes.
5. The electrostatic input device according to claim 1, wherein the first sensor electrode has a circular shape, and the second sensor electrode has a circular ring shape around the first sensor electrode in the plan view,
and wherein the plurality of electronic parts are arranged around the second sensor electrode at equal angular intervals viewed from a center of the first sensor electrode.
6. The electrostatic input device according to claim 1, further comprising:
a driving integrated circuit disposed on a back surface of the multi-layer substrate and connected to the plurality of electronic parts which are formed on a front surface of the multi-layer substrate through the multi-layer substrate, the driving integrated circuit being configured to drive the plurality of electronic parts; and
a second shield electrode disposed in a first inner layer of the multi-layer substrate and connected to the first shield electrode through the multi-layer substrate,
wherein the second shield electrode is arranged such that the second shield electrode overlaps each of the first sensor electrode, the second sensor electrode, and the driving integrated circuit in the plan view.
7. The electrostatic input device according to claim 6, further comprising:

a first wiring that connects the first sensor electrode to the measurement circuit through the multi-layer substrate and a second wiring that connects the second sensor electrode to the measurement circuit through the multi-layer substrate, wherein the measurement circuit is disposed on the back surface of the multi-layer substrate, and wherein the first wiring and the second wiring are disposed in a second inner layer provided between the front surface and the first inner layer of the multi-layer substrate.

8. The electrostatic input device according to claim 7, further comprising:

a third wiring disposed on the back surface of the multi-layer substrate and connecting the driving circuit to the plurality of electronic parts through the multi-layer substrate; and a grounding electrode disposed on the back surface at a position overlapping the first sensor electrode and the second sensor electrode in the plan view, wherein the grounding electrode includes:

a first grounding electrode portion made of a solid metal layer without any gap or opening, the first grounding electrode portion surrounding the third wiring in a region within a predetermined distance from the third wiring in the plan view; and a second grounding electrode portion made of a mesh-like metal layer with gaps and/or openings and formed continually to the first grounding electrode portion, the second grounding electrode portion being provided outside the region surrounding the third wiring.

9. The electrostatic input device according to claim 1, further comprising:

a plurality of the first sensor electrodes; and a plurality of the second sensor electrodes, each surrounding corresponding one of the plurality of the first sensor electrodes, wherein the plurality of electronic parts are disposed around each second sensor electrode, and wherein the first shield electrode is made of a solid metal layer without any gap or opening, the first shield electrode surrounding each second sensor electrode and the plurality of electronic parts disposed around the second sensor electrode in the plan view.

* * * * *